United States Patent
Nanba (12)

(10) Patent No.: US 6,518,606 B1
(45) Date of Patent: Feb. 11, 2003

(54) SEMICONDUCTOR DEVICE PERMITTING ELECTRICAL MEASUREMENT OF CONTACT ALIGNMENT ERROR

(75) Inventor: Osamu Nanba, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/504,292

(22) Filed: Feb. 15, 2000

(30) Foreign Application Priority Data

Jun. 15, 1999 (JP) ............................................ 11-167731

(51) Int. Cl.[7] ........................................... H01L 27/148
(52) U.S. Cl. ...................................................... 257/217
(58) Field of Search .......................... 430/14; 438/622, 438/486; 257/48, 229, 217; 204/406; 256/227.18

(56) References Cited

U.S. PATENT DOCUMENTS 6,103,615 A * 8/2000 Sugasawara ................ 438/622

OTHER PUBLICATIONS

D Kahng, T.A. Shankoff, T.T. Sheng and S.E. Haszko; "A Method for Area Saving Palnar Isolation Oxides Using Oxidation Protected Sidewalls", Nov. 1980, J Electrochem. Soc.: Solid State Sceince and Technology; p. 2468–2471.*

* cited by examiner

Primary Examiner—John F. Niebling
Assistant Examiner—Andre Stevenson
(74) Attorney, Agent, or Firm—Rabin & Berdo, P.C.

(57) ABSTRACT

A semiconductor device in which an integrated circuit is formed includes a resistance-measurement area with conductive members disposed in at least two different layers, and an electrode pattern. The electrode pattern includes contact plugs that, depending on their alignment, make electrical contact with different conductive members. Contact alignment error is measured by measuring the electrical resistance between a pair of electrodes in the electrode pattern.

15 Claims, 6 Drawing Sheets

SEMICONDUCTOR DEVICE PERMITTING ELECTRICAL MEASUREMENT OF CONTACT ALIGNMENT ERROR

BACKGROUND OF THE INVENTION

The present invention relates to a semiconductor device, more particularly to the measurement of contact alignment error in the manufacture of semiconductor integrated circuits.

A semiconductor integrated circuit comprises multiple layers of conductive patterns. The different layers are interconnected by conductive plugs formed in narrow holes referred to as contact holes. The contact holes are formed by photolithography. It is essential that the contact holes be accurately aligned, so that electrical contact can be made with the patterns to be interconnected, and unwanted contact with other patterns can be avoided. Monitoring the accuracy of contact alignment is an essential aspect of quality control in the photolithography process.

Contact alignment error is conventionally measured by the use of optical patterns such as vernier patterns. Optical measurements, however, are inherently difficult to perform with high accuracy and reliability. A particular problem is that optical measurements do not directly measure the property of interest, namely electrical continuity between the contact plugs and the conductive patterns in different layers.

SUMMARY OF THE INVENTION

An object of the present invention is to measure contact alignment error in a semiconductor device electrically.

Another object of the invention is to measure contact alignment error in a semiconductor device with high accuracy and reliability.

The invention provides a semiconductor device with a resistance-measurement area comprising a plurality of conductive members and an electrode pattern. The conductive members are disposed in at least two different layers of the semiconductor device. At least two of the conductive members have differing electrical resistances. The electrode pattern includes contact plugs making electrical contact with different conductive members, depending on the alignment of the contact plugs.

Contact alignment error is measured by measuring the electrical resistance between a pair of electrodes in the electrode pattern.

The measurement is accurate and reliable, because it directly determines whether there is electrical continuity between the contact plugs and the different conductive members.

DETAILED DESCRIPTION OF THE INVENTION

Figure 1:
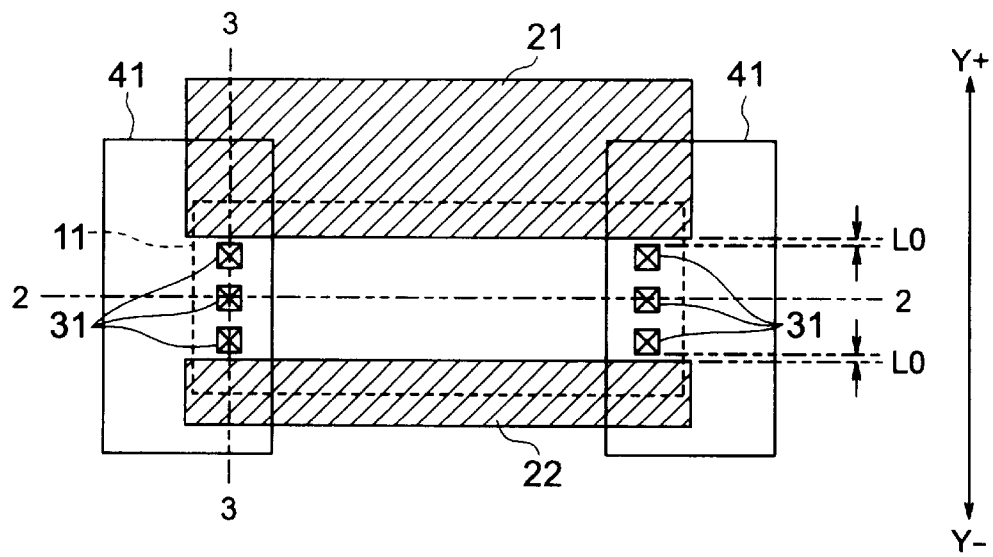
FIG. 1 is a plan view of part of a semiconductor device illustrating a first embodiment of the invention.

Embodiments of the invention will be described with reference to the attached drawings, in which like parts are indicated by like reference characters.

Illustrating a first embodiment of the invention, FIG. 1 shows a plan view of a resistance-measurement area in a semiconductor device. The illustrated area includes a first conductive member 11 formed in a substrate layer of the semiconductor device, a second conductive member 21 and third conductive member 22 formed in an intermediate layer, and six contact plugs 31 electrically coupling the first conductive member 11 to a pair of electrodes 41, which are formed in an upper layer of the semiconductor device. In FIG. 1 the contact plugs 31 are correctly aligned with the conductive members, being disposed between the second and third conductive members 21, 22. The inner edges of the second and third conductive members 21, 22 are separated from the nearest neighboring contact plugs 31 by a distance L0 in the vertical direction in the drawing, referred to below as the Y direction. The second conductive member 21 is wider than the third conductive member 22 in the Y direction.

Figure 2:
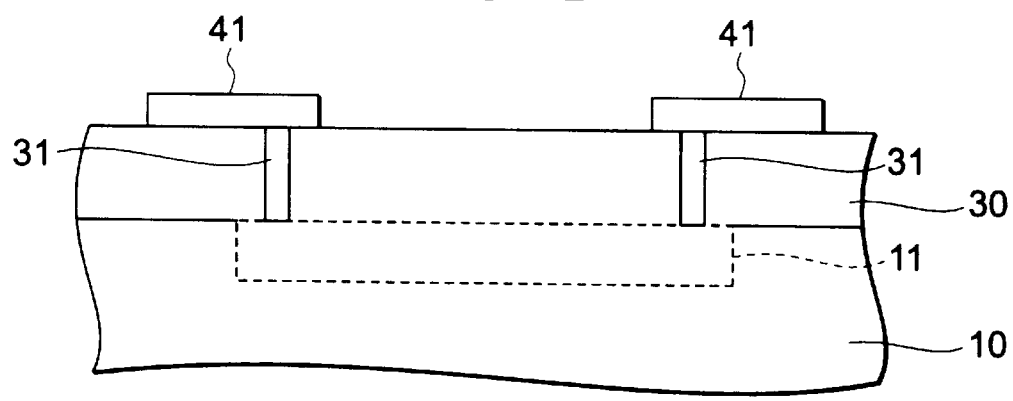
FIG. 2 is a sectional view through line 2—2 in FIG. 1.

Referring to the sectional view in FIG. 2, the first conductive member 11 is, for example, a diffusion region formed by diffusion of an impurity into a semiconductor substrate 10. The substrate 10 is separated from the electrodes 41 by a dielectric material 30. The contact plugs 31 extend through contact holes in the dielectric material 30. Referring to the sectional view in FIG. 3, the second and third conductive members 21, 22 are disposed at an intermediate level in the dielectric material 30.

The first conductive member 11 is part of a diffusion pattern that also includes, for example, source and drain regions of transistors in integrated circuits (not visible) formed in the substrate 10. The second and third conductive members 21, 22 are part of a conductive pattern that also includes, for example, gate electrodes of the transistors. The electrical resistance of the second and third conductive members 21, 22 is lower than the electrical resistance of the first conductive member 11.

The contact holes for the contact plugs 31 are part of a contact hole pattern created in the dielectric material 30 by photolithography. The contact plugs 31. and electrodes 41 may be part of a single metal pattern that also interconnects the transistors and other circuit elements in the integrated circuits. Alternatively, the contact plugs 31 may be formed separately from the electrodes 41.

Figure 3:
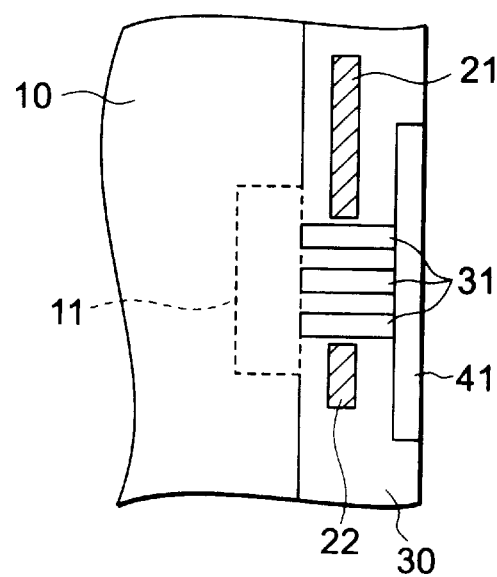
FIG. 3 is a sectional view through line 3—3 in FIG. 1.

The semiconductor device partly illustrated in FIGS. 1, 2, and 3 is, for example, a semiconductor wafer in which a plurality of integrated circuits are fabricated simultaneously. A plurality of resistance-measurement areas of the illustrated type may be disposed in different locations and different orientations on the semiconductor wafer.

Next, the operation of the first embodiment will be described.

After the semiconductor integrated circuit fabrication process has been completed through at least the metalization step that forms the electrodes 41, the semiconductor device is mounted in test equipment that measures the electrical resistance between the two electrodes 41. If the contact plugs 31 are correctly aligned, as shown in FIG. 1, the measured resistance has a first value equal to the sum of the resistance of the first conductive member 11, the resistance of the contact plugs 31, and the resistance of the electrodes 41.

Figure 4:
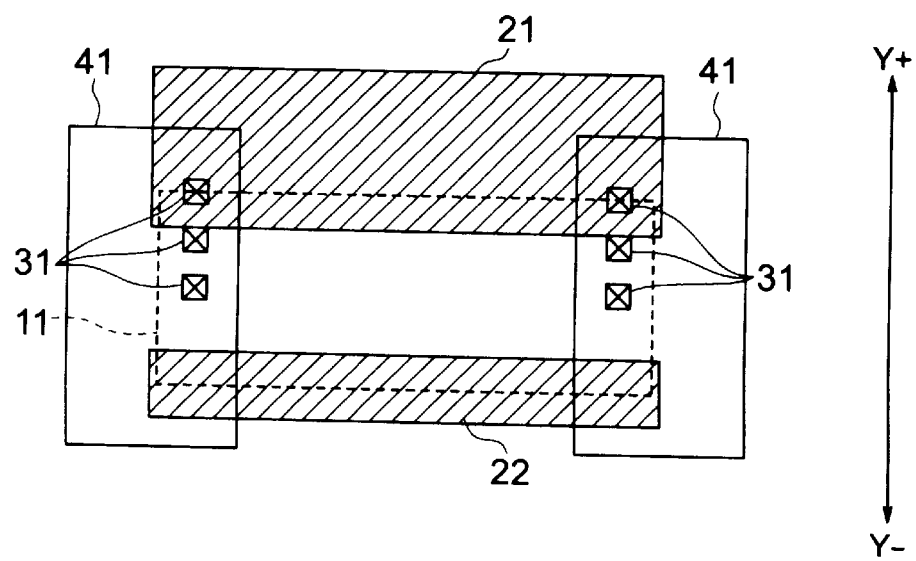
FIG. 4 is a plan view illustrating the detection of contact alignment error in the first embodiment.

If the contact plugs 31 are displaced by an amount equal to or greater than L0 in the positive Y direction (the upward direction in the drawings), as illustrated in FIG. 4, then a pair of contact plugs 31 will make contact with the second conductive member 21, creating a short circuit. A second, much lower resistance value will now be measured, because the two electrodes 41 are interconnected by both the first and second conductive members 11, 21 in parallel.

If the contact plugs 31 are displaced by an amount equal to or greater than L0 in the negative Y direction (the downward direction in the drawings), then a pair of contact plugs 31 will make contact with the third conductive member 22. The measured resistance will have a third value intermediate between the first and second resistance values, because the third conductive member 22, being narrower than the second conductive member 21, has a higher electrical resistance than the second conductive member 21.

The first resistance value indicates that the contact plugs 31 are correctly aligned to within ±L0 in the Y direction. Measurement of the first resistance value also provides direct confirmation that the contact plugs 31 make electrical contact with the first conductive member 11, as desired, and do not make unwanted electrical contact with the second and third conductive members 21, 22.

The second or third resistance value indicates a contact alignment error in the Y direction, and indicates whether the error is in the positive or negative Y direction, so that proper corrective action can be taken.

With an appropriate choice of the distance L0, the first embodiment provides a highly reliable method of detecting contact alignment errors that might cause short circuits or other electrical faults in integrated circuits.

Next, a second embodiment will be described.

Figure 5:
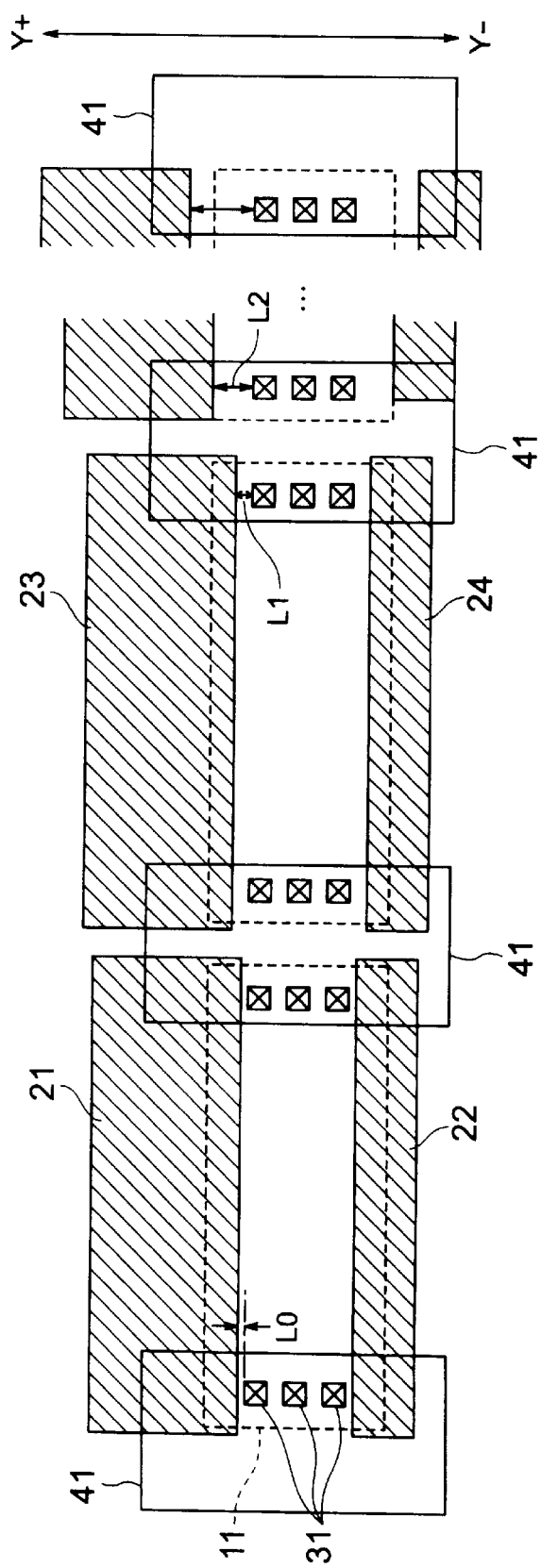
FIG. 5 is a plan view of part of a semiconductor device illustrating a second embodiment of the invention.

Referring to FIG. 5, the resistance-measurement area in the second embodiment comprises a series of areas similar to the area shown in FIG. 1, placed end to end, electrically coupled to one another by the electrodes 41, with variable separation (L0, L1, L2, . . . ) between the conductive members in the intermediate layer and the intervening contact plugs 31. For the first two conductive members 21, 22 in the intermediate layer, the separation L0 is, for example, the same as in the first embodiment. For the next two conductive members 23, 24 in the intermediate layer, the separation L1 widens, and the widening continues until the end of the series of areas.

When the resistance measurement is performed, the electrical resistance between the outermost two electrodes 41 is measured. If the contact plugs 31 are correctly aligned, as shown in FIG. 5, the measured resistance is equal to the sum of the resistances of the electrodes 41 and contact plugs 31, and the resistances of all the substrate conductive members 11.

Figure 6:
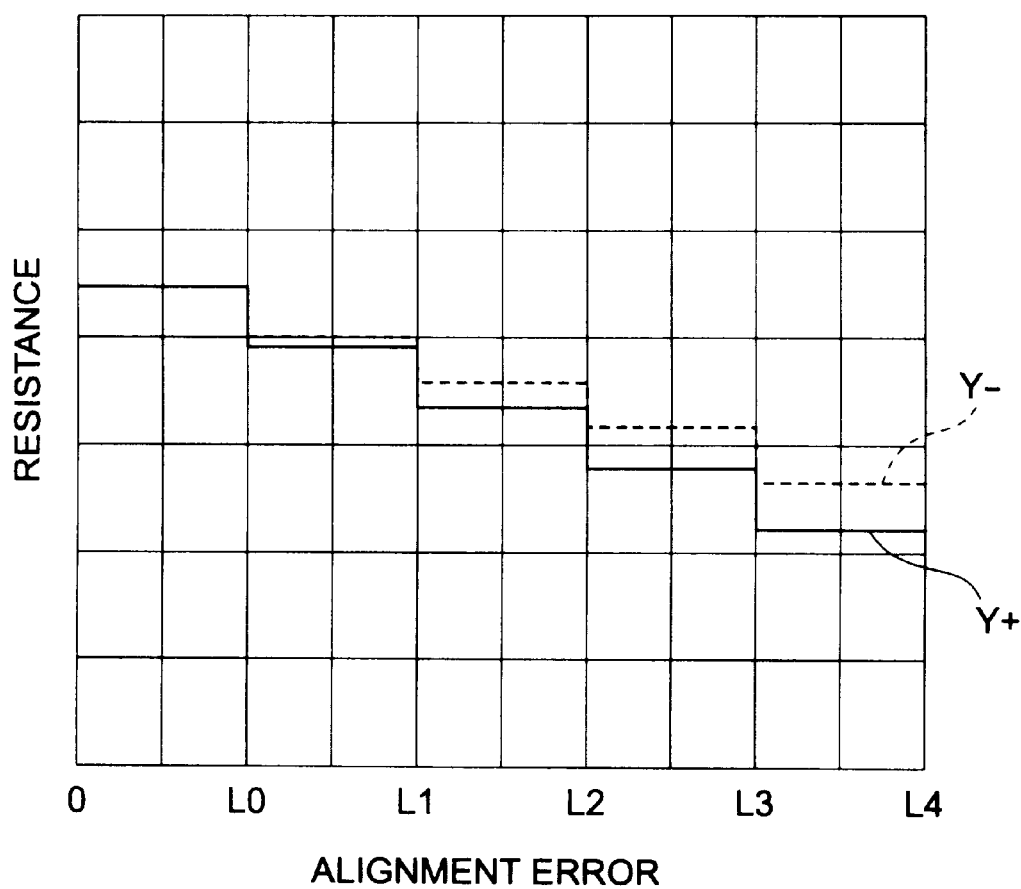
FIG. 6 is a graph illustrating the detection of different degrees of alignment error in the second embodiment.

If there is an alignment error in the Y direction, the measured resistance decreases as shown in FIG. 6. The vertical axis in FIG. 6 indicates resistance, in arbitrary units. The horizontal axis indicates the absolute value of the alignment error in the Y direction. As the alignment error increases, short circuits are formed with increasing numbers of conductive members in the intermediate layer, and the electrical resistance decreases in a step-like manner. The solid line marked Y+ indicates the measured resistance value when the alignment error is in the positive Y direction. The dotted line marked Y− indicates the measured resistance when the alignment error is in the negative Y direction.

The second embodiment provides reliable detection of contact alignment errors equal to or greater than L0, and indicates whether the error is in the positive or negative Y direction, as in the first embodiment. The resistance value measured in the second embodiment also indicates the approximate size of the error, which facilitates the taking of corrective action.

Next, a third embodiment will be described.

Figure 7:
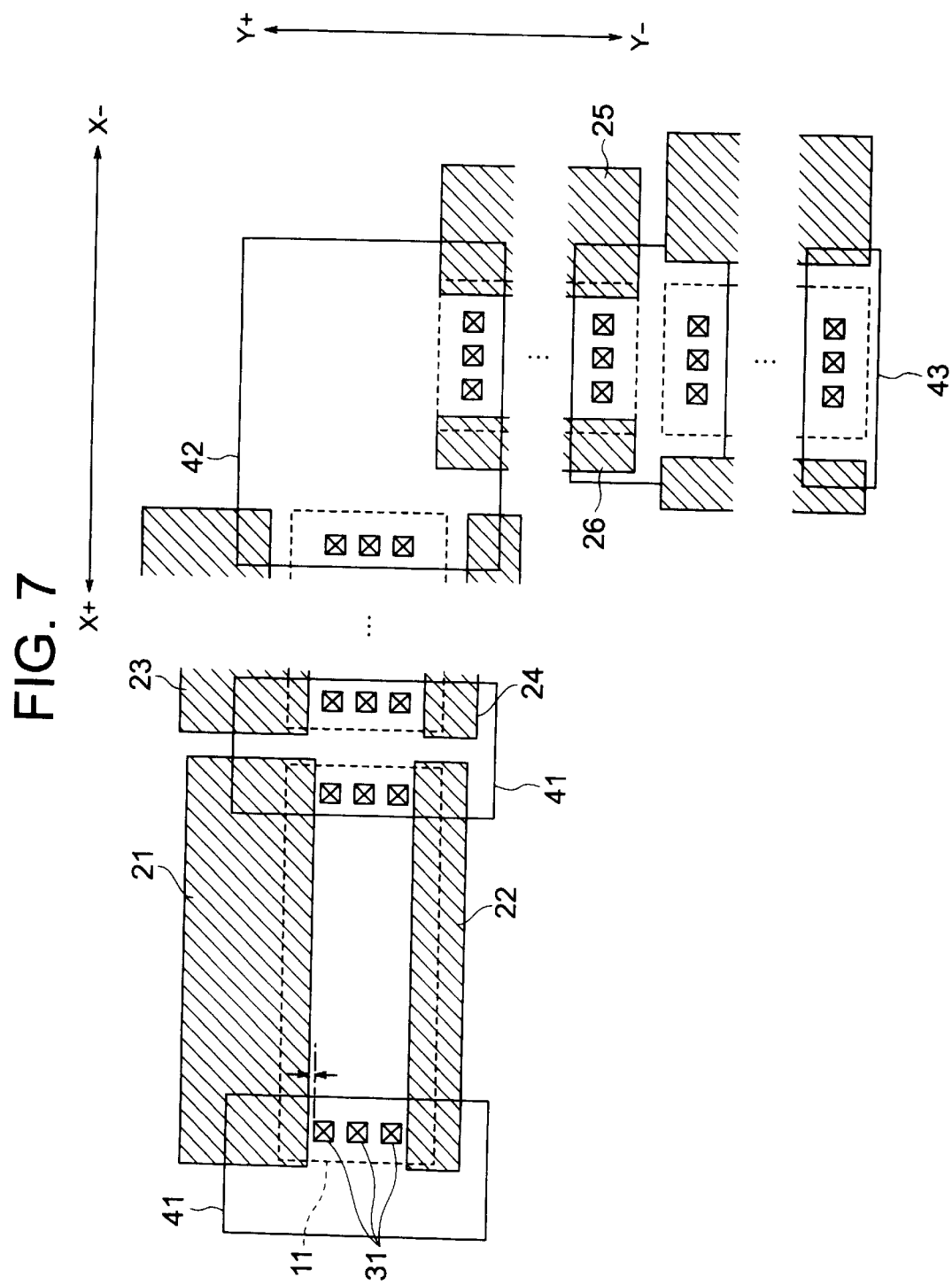
FIG. 7 is a plan view of part of a semiconductor device illustrating a third embodiment of the invention.

Referring to FIG. 7, the third embodiment provides two series of conductive members 11, 21, 22, 23, 24, . . . , with contact plugs 31 and electrodes 41, as described in the second embodiment. The two series are disposed at right angles to one another, and are electrically coupled into a single circuit by a common electrode 42 where the right angle occurs.

Alignment error in both the horizontal (X) and vertical (Y) directions can be determined from a single resistance measurement between the two electrodes 41, 43 at the outer ends of the right-angled series of areas, provided that in the intermediate layer, the conductive members in the X-arm, disposed to the left of electrode 42, differ in size from the conductive members in the Y-arm, disposed below electrode 42. For example, if conductive members 21 and 25 have different sizes, and conductive members 22 and 26 have different sizes, then a horizontal alignment error that causes a short circuit with conductive member 25 or 26 can be distinguished from a vertical alignment error that causes a short circuit with conductive member 21 or 22, because the different sizes create different electrical resistances.

Alternatively, a first resistance measurement can be made from the electrode 41 at the end of the X-arm to the middle electrode 42, to measure vertical alignment error, and a second resistance measurement can be made from the middle electrode 42 to the electrode 43 at the end of the Y-arm, to measure horizontal alignment error. In this case, the conductive members in the X-arm may have the same size as the conductive members in the Y-arm.

The third embodiment provides the same effects as the second embodiment, with the additional capability to measure alignment error in two dimensions.

Next, a fourth embodiment will be described.

Figure 8:
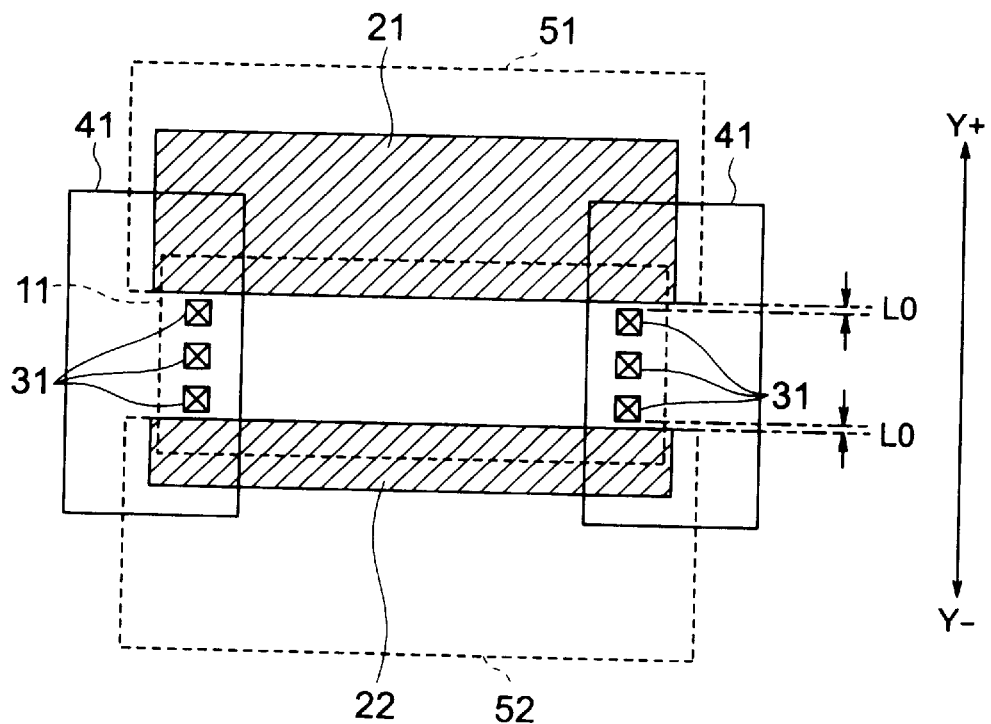
FIG. 8 is a plan view of part of a semiconductor device illustrating a fourth embodiment of the invention.

Referring to FIG. 8, the fourth embodiment adds a further pair of conductive members 51, 52 to the structure of the first embodiment. The additional conductive members 51, 52 are disposed in a layer intermediate between the electrodes 41 and the substrate layer, but at a different level from the intermediate layer including conductive members 21, 22. In the illustrated state there is no alignment error. The inner edges of conductive members 51, 52 are aligned with the inner edges of conductive members 21, 22, and both pairs of inner edges are separated by a distance L0 from the nearest neighboring contact plugs 31.

The fourth embodiment detects alignment errors that cause short circuits between the contact plugs 31 and any of the conductive members 21, 22, 51, 52 in the intermediate layers. Correct alignment of the contact plugs 31 with respect to conductive patterns in two separate intermediate layers can thus be confirmed with a single resistance measurement.

The embodiments above have six contact plugs 31 for each conductive member 11 with which electrical contact is desired. This number of contacts was chosen to provide adequate electrical continuity even if two of the contact plugs 31 miss the conductive member 11. The invention is of course not limited to six contact plugs per conductive member, but it is desirable to have at least two contact plugs at each end of each conductive member with which electrical contact is desired.

Those skilled in the art will recognize that further variations are possible within the scope claimed below.

What is claimed is:

1. A semiconductor device including an integrated circuit and a resistance-measurement area, the resistance-measurement area comprising:
    a plurality of conductive members disposed in at least two different layers of the semiconductor device, each one of said conductive members occupying only one of said at least two different layers, at least two of said conductive members having mutually differing electrical resistances; and
    an electrode pattern with contact plugs, the contact plugs making electrical contact with different ones of said conductive members, depending on alignment of said contact plugs.

2. The semiconductor device of claim 1, wherein said conductive members include:
    a first conductive member, disposed in a first layer of the semiconductor device, making electrical contact with said contact plugs if said contact plugs are correctly aligned;
    a second conductive member, disposed on one side of said contact plugs in a second layer of the semiconductor device, separated by a predetermined distance from said contact plugs if said contact plugs are correctly aligned; and
    a third conductive member, disposed on another side of said contact plugs in said second layer of the semiconductor device, separated by said predetermined distance from said contact plugs if said contact plugs are correctly aligned, differing in electrical resistance from said second conductive member.

3. The semiconductor device of claim 2, wherein said second conductive member and said third conductive member are disposed on mutually opposite sides of said contact plugs.

4. The semiconductor device of claim 2, wherein said first conductive member differs in electrical resistance from said second conductive member and said third conductive member.

5. The semiconductor device of claim 1, wherein said conductive members include at least two conductive members disposed in a single one of said layers, separated by different distances from said contact plugs if said contact plugs are correctly aligned.

6. A semiconductor device including an integrated circuit and a resistance-measurement area, the resistance-measurement area comprising:
    a plurality of conductive members disposed in at least two different layers of the semiconductor device, at least two of said conductive members having mutually differing electrical resistances;
    an electrode pattern with contact plugs, the contact plugs making electrical contact with different ones of said conductive members, depending on alignment of said contact plugs;
    wherein said conductive members include at least two conductive members disposed in a single one of the layers, separated by different distances from said contact plugs if said contact plugs are correctly aligned;
    wherein said at least two conductive members include:
        a first plurality of conductive members separated from said contact plugs by different distances in a first direction, if said contact plugs are correctly aligned; and
        a second plurality of conductive members, separated from said contact plugs by different distances in a second direction at right angles to said first direction, if said contact plugs are correctly aligned.

7. The semiconductor device of claim 1, wherein said conductive members are disposed in at least three different layers of said semiconductor device.

8. The semiconductor device of claim 7, wherein said conductive members include:
    a first conductive member, disposed in a first layer of the semiconductor device, making electrical contact with said contact plugs if said contact plugs are correctly aligned;
    a second conductive member, disposed on one side of said contact plugs in a second layer of the semiconductor device, separated by a predetermined distance from said contact plugs if said contact plugs are correctly aligned; and
    a third conductive member, disposed on said one side of said contact plugs in a third layer of the semiconductor device, separated by said predetermined distance from said contact plugs if said contact plugs are correctly aligned.

9. A semiconductor device including an integrated circuit and a resistance-measurement area, the resistance-measurement area comprising:
    a plurality of conductive members disposed in at least three different layers of the semiconductor device, at least two of said conductive members having mutually differing electrical resistances; and
    an electrode pattern with contact plugs, the contact plugs making electrical contact with different ones of said conductive members, depending on alignment of said contact plugs;
    wherein said conductive members include:
        a first conductive member, disposed in a first layer of the semiconductor device, making electrical contact with said contact plugs if said contact plugs are correctly aligned;
        a second conductive member, disposed on one side of said contact plugs in a second layer of the semiconductor device, separated by a predetermined distance from said contact plugs if said contact plugs are correctly aligned; and
        a third conductive member, disposed on said one side of said contact plugs in a third layer of the semiconductor device, separated by said predetermined distance from said contact plugs if said contact plugs are correctly aligned;
    wherein said second conductive member and said third conductive member have different electrical resistances.

10. The semiconductor device of claim 9, wherein said first conductive member differs in electrical resistance from said second conductive member and said third conductive member.

11. The semiconductor device of claim 2, wherein said electrode pattern includes a pair of electrodes electrically connected to said first conductive member by respective contact plugs if said contact plugs are correctly aligned.

12. The semiconductor device of claim 11, wherein each of said electrodes is electrically connected to said first conductive member by at least two contact plugs if said contact plugs are correctly aligned.

13. The semiconductor device of claim 4, wherein said second conductive member and said third conductive member have different widths.

14. The semiconductor device of claim 1, wherein said conductive members include:

a first plurality of conductive members disposed in a first one of said layers, electrically connected in series by said electrode pattern and said contact plugs if said contact plugs are correctly aligned;

a second plurality of conductive members disposed in a second one of said layers on one side of said contact plus, separated by different distances from said contact plugs if said contact plugs are correctly aligned; and a third plurality of conductive members disposed in said second one of said layers on another side of said contact plugs, separated by different distances from said contact plugs if said contact plugs are correctly aligned.

15. The semiconductor device of claim 14, wherein said first plurality of conductive members have a first width, and said second plurality of conductive members have a second width different from said first width.

* * * * *